United States Patent
Müller

(10) Patent No.: US 11,150,289 B2
(45) Date of Patent: Oct. 19, 2021

(54) INSULATION MONITOR

(71) Applicant: Audi AG, Ingolstadt (DE)

(72) Inventor: Kai Müller, Bretzfeld (DE)

(73) Assignee: AUDI AG, Ingolstadt (DE)

( * ) Notice: Subject to any disclaimer, the term of this patent is extended or adjusted under 35 U.S.C. 154(b) by 478 days.

(21) Appl. No.: 15/933,231

(22) Filed: Mar. 22, 2018

(65) Prior Publication Data
US 2018/0275180 A1 Sep. 27, 2018

(30) Foreign Application Priority Data
Mar. 23, 2017 (DE) .......................... 102017204885.9

(51) Int. Cl.
G01R 31/00 (2006.01)
B60L 58/30 (2019.01)
B60L 3/00 (2019.01)
G01R 31/52 (2020.01)

(52) U.S. Cl.
CPC .......... *G01R 31/007* (2013.01); *B60L 3/0053* (2013.01); *B60L 3/0069* (2013.01); *B60L 58/30* (2019.02); *G01R 31/52* (2020.01); *Y02T 10/70* (2013.01)

(58) Field of Classification Search
CPC . G01R 31/007; G01R 31/025; Y02T 10/7005; B60L 3/0069; B60L 3/0053; B60L 58/30; G08B 13/2462; G08B 21/12; H01L 2924/0002; H01L 2924/00; G06Q 10/08
USPC .. 324/500, 503, 509, 750.3, 765.01, 761.01, 324/76.11, 76.37, 425–450
See application file for complete search history.

(56) References Cited

U.S. PATENT DOCUMENTS

| 9,069,025 B2* | 6/2015 | Schaefer | G01R 27/025 |
| 2003/0214306 A1* | 11/2003 | Beutelschiess | B60L 3/00 324/511 |
| 2011/0148428 A1* | 6/2011 | Lasson | G01R 27/18 324/503 |
| 2014/0084935 A1* | 3/2014 | Chatroux | G01R 31/14 324/503 |

FOREIGN PATENT DOCUMENTS

| CN | 102495373 A | 6/2012 |
| CN | 105486923 A | 4/2016 |
| DE | 101 41 504 A1 | 3/2003 |
| DE | 10 2013 012 151 A1 | 1/2015 |
| DE | 10 2013 226 595 A1 | 6/2015 |
| DE | 10 2015 200 174 A1 | 7/2016 |
| JP | 2004-104923 A | 4/2004 |
| WO | 10 2014 204 870 A1 | 9/2015 |

* cited by examiner

*Primary Examiner* — Melissa J Koval
*Assistant Examiner* — Trung Q Nguyen
(74) *Attorney, Agent, or Firm* — Seed Intellectual Property Law Group LLP

(57) ABSTRACT

The presented invention relates to a method for monitoring an insulation state of a first high-voltage network and an insulation state of at least one further high-voltage network of a vehicle, wherein a single insulation monitor is connected to the first high-voltage network and to the at least one further high-voltage network, and wherein, by means of the insulation monitor, a first insulation measurement, initially, is carried out, in a periodically repeated sequence, on the first high-voltage network, and, then, a further insulation measurement is carried out in each case on the at least one further high-voltage network.

13 Claims, 1 Drawing Sheet

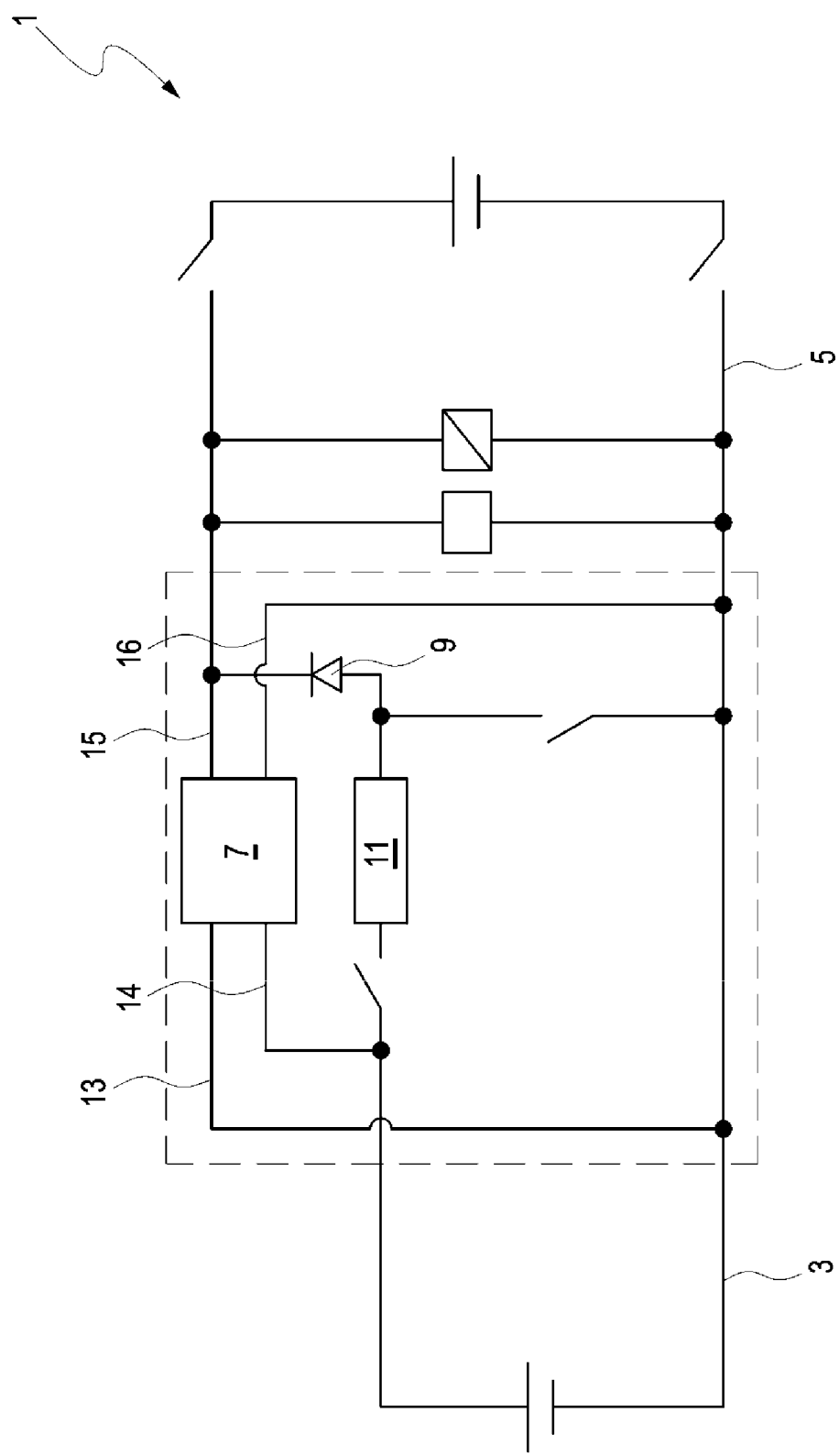

INSULATION MONITOR

BACKGROUND

Technical Field

The invention presented here concerns a method for monitoring an insulation state of a first high-voltage network, and an insulation state of a second high-voltage network of a vehicle. Furthermore, the presented invention concerns an insulation monitor configured to carry out the presented procedure.

Description of the Related Art

All electrical devices must have certain insulation properties, since, otherwise, they cannot be operated safely. In particular, live parts, such as cables, must be insulated with materials that have a particularly high electrical resistance, so that an electrical current to be routed via the live parts only runs via the live parts, and a short-circuit to an environment is avoided.

Safety regulations make it necessary for live components of a vehicle—in particular, those components that are part of a high-voltage network—to be monitored with regard to their electrical insulation.

Since several high-voltage networks are normally used in vehicles with electric drive systems, as a rule, several insulation monitors are used, each of which is assigned to one network, e.g., to a high-voltage network, and is monitored with regard to possible damage to an insulation material used for the electrical insulation of the network.

In the German publication DE 10 2015 200 174 A1, a device for testing a vehicle electrical system consisting of two high-voltage networks connected via a coupling medium is presented.

The German publication DE 101 41 504 A1 discloses a device for detecting a fault in two- or multi-voltage on-board networks with a multiplicity of monitoring modules.

A device for monitoring an electrical insulation in an on-board network of a vehicle with at least two current-measuring units is disclosed in the German publication DE 10 2014 204 870 A1.

BRIEF SUMMARY

Against this background, it is an aim of the presented invention to provide a cost-effective way of monitoring an electrical insulation of two voltage networks of a vehicle.

In order to achieve the aforementioned aim, a method for monitoring an insulation state of a first high-voltage network and an insulation state of at least one further high-voltage network of a vehicle is presented, in which a single insulation monitor is connected to the first high-voltage network and to the at least one further high-voltage network, and in which, by means of the insulation monitor, a first insulation measurement, initially, is carried out, in a periodically repeated sequence, on the first high-voltage network, and, then, a further insulation measurement is carried out in each case on the at least one further high-voltage network.

Embodiments of the presented invention will become apparent from the description and the dependent claims.

The method presented here is used, in particular, to monitor an electrical insulation, i.e., to monitor an integrity of a sheath layer—surrounding, for example, a particular wire—for several high-voltage networks. For this purpose, it is intended that a single insulation monitor be electrically connected to the particular high-voltage networks to be measured. For example, the insulation monitor can be arranged in a transformer that is connected between the respective high-voltage networks, in order to convert a first voltage level that is present in a first high-voltage network into a further voltage level that is present in a further high-voltage network.

In order to make it possible to monitor several high-voltage networks by means of a single insulation monitor, it is intended, in accordance with the invention, that the insulation measurements in question, i.e., processes to be carried out to determine an insulation state, such as, for example, an application of a test voltage and a subsequent current measurement to determine an electrical resistance which is to be tested, be carried out in a periodically repeated test cycle on each high-voltage network. This means that the insulation monitor first carries out a first insulation measurement on a first high-voltage network and then carries out further insulation measurements for each additional high-voltage network. Correspondingly, various insulation measurements are carried out in a cyclical process on the respective high-voltage networks. It is particularly envisaged that a particular test cycle, in which an insulation measurement has been carried out at least once on all high-voltage networks, be carried out within a specified time interval—preferably, within a time interval of 30 seconds.

It is particularly envisaged that the first high-voltage network envisaged according to the invention, together with at least one other high-voltage network, form an overall network for supplying the same or different components of a vehicle with electrical current. In particular, a first voltage is applied to a particular high-voltage network, and a second voltage, which differs from the first voltage, is applied to a further high-voltage network connected to the high-voltage network. The first high-voltage network can, for example, be a traction network of a vehicle, which, together with a primary circuit of the vehicle as a further high-voltage network, forms a supply network of the vehicle.

In the context of the invention presented here, an insulation monitor means a device that is configured to carry out an insulation measurement on electrical cables. For this purpose, an insulation monitor can comprise a current measuring device and a control device, by means of which the measured values determined by the current measuring device are to be analyzed.

In a possible configuration of the method presented, it is intended that, for the insulation measurement, a first electrical resistance determined on the first high-voltage network be compared with a first threshold value, and a further electrical resistance determined on the at least one further high-voltage network be compared with a further threshold value, and that a first warning be issued in the event that the first electrical resistance deviates from the first threshold value by an amount which is greater than a first tolerance value, and that a further warning be issued in the event that the further electrical resistance deviates from the further threshold value by an amount which is greater than a second tolerance value.

In order to monitor or check the insulation status of a particular high-voltage network, it is intended, according to the invention, that an insulation monitor carry out an insulation measurement. For this purpose, the insulation monitor can use any technically suitable method for measuring or testing an insulation quality. In particular, it is envisaged that the insulation monitor carry out a resistance-based method, in which a test voltage is applied to a high-voltage network to be tested, and a current flowing out via the high-voltage network is measured at the same time. An electrical resistance of the high-voltage network can be determined on the basis of the known test voltage and the measured current. Should an electrical resistance value determined for a particular high-voltage network deviate from a given threshold value, it can be assumed that an insulation layer of the high-voltage network has been damaged, and a corresponding fault message must be issued.

In order to specify a tolerance range within which fluctuations of the electrical resistance are accepted or do not lead to a fault message, an amount by which a determined electrical resistance deviates from a specified threshold value can be compared with a tolerance value, so that, for example, a fault message will be issued only when the amount is greater than the tolerance value. Here, a fault message or warning message can be issued specifically for a fault in a particular high-voltage network or, in general, for a fault in an overall network consisting of various high-voltage networks.

Since an electrical insulation usually degrades over a long period of time, it can be provided that a warning message indicating slight damage to the electrical insulation be issued in the event that an electrical resistance determined on a particular high-voltage network deviates from a given first threshold value by an amount exceeding a tolerance range. Furthermore, it can be provided that, in the event that an electrical resistance determined on a high-voltage network differs from a given second threshold value by an amount exceeding a tolerance range, a fault message be issued indicating severe damage to the electrical insulation. Fault messages of this kind can, for example, occur in case of short circuits.

It is conceivable that a threshold value or a tolerance value for balancing with a value of a determined electrical resistance of a particular high-voltage network be selected as a function of a state of a vehicle containing the high-voltage network and/or as a function of current environmental conditions, such as, for example, a current temperature.

By means of various insulation measurements carried out on different high-voltage networks, an entire supply network can be checked, piece-by-piece, in periodic, repetitive test cycles.

In a further possible embodiment of the presented method, it is provided that a time interval between 0.5 seconds and 7.5 seconds—in particular, a time interval of exactly 7 seconds—be selected as the period length between the respective insulation measurements.

For example, in order to create a test cycle for an overall network with two high-voltage networks that checks the overall network at least once within 30 seconds, it can be provided that the relevant lines or poles of the two high-voltage networks be checked at a specified time interval of 0.5 seconds to 7.5 seconds. Accordingly, for example, four measurements are carried out within 28 seconds at 7-second intervals, and correspondingly in less than 30 seconds, thus meeting a standard safety requirement, such as that specified in the "VW 80303/LV123" standard.

In a further possible embodiment of the presented method, it is provided that the periodically repeated sequence run according to the following scheme:

a) insulation measurement on an electrically positively-charged part of the first high-voltage network at a time t1;

b) insulation measurement on an electrically negatively-charged part of the first high-voltage network at a time t2;

c) insulation measurement on an electrically positively-charged part of the at least one further high-voltage network at a time t3;

d) insulation measurement on an electrically negatively-charged part of the at least one further high-voltage network at a time t4, wherein the times t1, t2, t3, and t4 are selected to be time-sequential.

By means of insulation measurements at different—in particular, temporally successive—points in time t1 to t4, a single insulation monitor can be used to check or monitor an overall network with several high-voltage networks—in the case on which the example described above is based, two high-voltage networks. Accordingly, when such a measurement sequence is used, additional, and correspondingly expensive, supplementary insulation monitors can, advantageously, be dispensed with.

Furthermore, the invention presented here concerns an insulation monitor for monitoring an insulation status of a first high-voltage network and an insulation status of at least one other high-voltage network of a vehicle. It is intended that the insulation monitor be configured to carry out, in a periodically repeating sequence, initially, a first insulation measurement on the first high-voltage network and, then, a further insulation measurement on the at least one further high-voltage network.

The presented insulation monitor serves, in particular, for carrying out the presented method.

In a possible embodiment of the presented insulation monitor, it is intended that the insulation monitor be located in a vehicle's on-board transformer.

Since an on-board transformer, such as a fuel-cell transformer of a fuel-cell vehicle, is connected to several high-voltage networks, an insulation monitor arranged in an on-board transformer can be connected particularly efficiently to the respective high-voltage networks that are already connected to the on-board transformer. For this purpose, the insulation monitor can, for example, use the electrical connections provided for connecting the high-voltage networks in question to the on-board transformer, in order to carry out an insulation measurement procedure on these high-voltage networks.

In a further possible embodiment of the presented insulation monitor, it is envisaged that the insulation monitor be designed as a unit independent of the vehicle and, via connecting lines to the first high-voltage network and connecting lines to the at least one further high-voltage network, be configured to access the first high-voltage network and the at least one further high-voltage network.

Of course, the insulation monitor according to the invention can also take the form of a separate unit or switchbox and—for example, as a monitoring module—be connected to a vehicle or the relevant high-voltage networks of a vehicle. To connect to a vehicle an insulation monitor designed as a separate unit, it is only necessary to connect the insulation monitor to a supply voltage of, for example, 12 volts and to establish an electrical connection between the insulation monitor and the particular high-voltage networks that are to be monitored.

In a further possible embodiment of the insulation monitor, it is provided that the insulation monitor be, in addition, configured to carry out, in an interval of 30 seconds, at least once, an insulation measurement on the first high-voltage network and, once, an insulation measurement on the at least one further high-voltage network.

In order to comply with applicable safety regulations, such as the "VW 80303/LV123" standard, for example, it is provided that an overall network be completely checked at least once every 30 seconds by the insulation monitor presented.

Additional advantages and embodiments of the invention arise from the description and the accompanying drawing.

It goes without saying that the features mentioned above and the features yet to be explained below can be used not only in the respectively specified combination, but also in other combinations or alone, without departing from the scope of the present invention.

BRIEF DESCRIPTION OF THE SEVERAL VIEWS OF THE DRAWING

The invention is schematically illustrated by way of embodiments in the drawing and is described schematically and in detail with reference to the drawing.

FIG. 1 shows a possible embodiment of the insulation monitor according to the invention in an overall network with two high-voltage networks.

DETAILED DESCRIPTION

FIG. 1 shows an overall network 1 which comprises a first high-voltage network 3, in the form of a primary circuit of a fuel cell of a fuel-cell vehicle, and a second high-voltage network 5, in the form of a traction network of the fuel-cell vehicle.

An insulation monitor 7 is arranged between the first high-voltage network 3 and the second high-voltage network 5. Since the insulation monitor 7 cannot test throughout by means of a blocking diode 9 of a voltage transformer 11 located between the first high-voltage network 3 and the second high-voltage network 5, the insulation monitor is connected to the first high-voltage network 3 via the first lines 13 and 14, and to the second high-voltage network 5 via the second lines 15 and 16.

In order to carry out an insulation measurement for the overall network 1, the insulation monitor 7 performs insulation measurements on the lines 13, 14, 15, and 16, one after the other. To do so, the insulation monitor 7 first applies a test voltage to the line 13 and measures an electrical current flowing along the line 13. On the basis of the known test voltage and the measured electrical current, the insulation monitor 7 calculates an electrical resistance of the line 13 and compares this with a setpoint value. If the value of the electrical resistance of the line 13 deviates from the setpoint value, the insulation monitor 7 issues a fault message. Once the insulation measurement on the line 13 has been completed, the insulation monitor 7 carries out corresponding insulation measurements on the lines 14, 15, and 16. Here, a time interval of, for example, 7 seconds can be provided between the individual insulation measurements, so that the lines 13, 14, 15, and 16, and, as a result, the overall network 1, are checked once within a time window of 30 seconds.

German patent application no. 10 2017 204 885.9, filed Mar. 23, 2017, is hereby incorporated herein by reference, in its entirety. The various embodiments described above can be combined to provide further embodiments. These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
monitoring an insulation state of a first high-voltage network and an insulation state of at least one further high-voltage network of a vehicle, which includes:
connecting a single insulation monitor to the first high-voltage network and to the at least one further high-voltage network;
via the single insulation monitor, periodically and repeatedly:
performing a first insulation measurement on the first high-voltage network; and
after the first insulation measurement, performing a further insulation measurement on the at least one further high-voltage network;
comparing a first electrical resistance determined on the first high-voltage network with a first threshold value;
comparing a further electrical resistance determined on the at least one further high-voltage network with a second threshold value;
issuing a first warning if the first electrical resistance deviates from the first threshold value by an amount which is greater than a first tolerance value; and
issuing a further warning if the further electrical resistance deviates from the second threshold value by an amount which is greater than a second tolerance value.

2. The method according to claim 1, wherein the vehicle comprises a fuel cell vehicle.

3. The method according to claim 1, comprising selecting a time interval between 0.5 seconds and 7.5 seconds between the first insulation measurement and the further insulation measurement.

4. The method according to claim 1 comprising selecting:
a traction network as the first high-voltage network, and
a primary circuit of the vehicle as the at least one further high-voltage network.

5. The method according to claim 1, comprising selecting a time interval of 7 seconds between the first insulation measurement and the further insulation measurement.

6. A method of using an insulation monitor for monitoring an insulation state of a first high-voltage network and an insulation state of at least one further high-voltage network of a vehicle comprising, periodically and repeatedly:
performing a first insulation measurement on the first high-voltage network, wherein performing the first insulation measurement includes:
performing an insulation measurement on an electrically positively charged part of the first high-voltage network at a first time; and
performing an insulation measurement on an electrically negatively charged part of the first high-voltage network at a second time; and
after performing the first insulation measurement, performing a further insulation measurement on the at least one further high-voltage networks wherein performing the further insulation measurement includes:
performing an insulation measurement on an electrically positively charged part of the at least one further high-voltage network at a third time; and
performing an insulation measurement on an electrically negatively charged part of the at least one further high-voltage network at a fourth time, wherein the first, second, third,
and fourth times are time-sequential.

7. The method of using the insulation monitor according to claim 6, wherein the insulation monitor is configured to be located in an on-board transformer of the vehicle.

8. The method of using the insulation monitor according to claim 7, wherein the insulation monitor is configured to be a unit independent of the vehicle and is configured to access the first high-voltage network via a first set of connection lines to the first high-voltage network, and to access the at least one further high-voltage network via a second set of connection lines to the at least one further high-voltage network.

9. The method of using the insulation monitor according to claim 7, wherein the insulation monitor is further configured to carry out, in an interval of 30 seconds, at least once, a first insulation measurement on the first high-voltage network and, at least once, a further insulation measurement on the at least one further high-voltage network.

10. A method, comprising:
monitoring an insulation state of a first high-voltage network and an insulation state of at least one further high-voltage network of a vehicle, which includes:
connecting a single insulation monitor to the first high-voltage network and to the at least one further high-voltage network;
via the single insulation monitor, periodically and repeatedly:
performing a first insulation measurement on the first high-voltage network, the performing of the first insulation measurement including:
performing an insulation measurement on an electrically positively charged part of the first high-voltage network at a time t1;
performing an insulation measurement on an electrically negatively charged part of the first high-voltage network at a time t2; and
after the first insulation measurement, performing a further insulation measurement on the at least one further high-voltage network, the performing of the further insulation measurement including:
performing an insulation measurement on an electrically positively charged part of the at least one further high-voltage network at a time t3; and
performing an insulation measurement on an electrically negatively charged part of the at least one further high-voltage network at a time t4, wherein the times t1, t2, t3, and t4 are selected to be time-sequential.

11. The method of claim 10, comprising:
comparing a first electrical resistance determined on the first high-voltage network with a first threshold value;
comparing a further electrical resistance determined on the at least one further high-voltage network with a second threshold value;
issuing a first warning if the first electrical resistance deviates from the first threshold value by an amount which is greater than a first tolerance value; and
issuing a further warning if the further electrical resistance deviates from the second threshold value by an amount which is greater than a second tolerance value.

12. A method of using an insulation monitor for monitoring an insulation state of a first high-voltage network and an insulation state of at least one further high-voltage network of a vehicle comprising, periodically and repeatedly:
performing a first insulation measurement on the first high-voltage network;
after performing the first insulation measurement, performing a further insulation measurement on the at least one further high-voltage network;
comparing a first electrical resistance determined on the first high-voltage network with a first threshold value;
comparing a further electrical resistance determined on the at least one further high-voltage network with a second threshold value;
issuing a first warning if the first electrical resistance deviates from the first threshold value by an amount which is greater than a first tolerance value; and
issuing a further warning if the further electrical resistance deviates from the second threshold value by an amount which is greater than a second tolerance value.

13. The method of using the insulation monitor of claim 12 wherein: performing of the first insulation measurement includes:
performing an insulation measurement on an electrically positively charged part of the first high-voltage network at a time t1;
performing an insulation measurement on an electrically negatively charged part of the first high-voltage network at a time t2; and
performing of the further insulation measurement includes:
performing an insulation measurement on an electrically positively charged part of the at least one further high-voltage network at a time t3; and
performing an insulation measurement on an electrically negatively charged part of the at least one further high-voltage network at a time t4, wherein the times t1, t2, t3, and t4 are selected to be time-sequential.

\* \* \* \* \*